(12) United States Patent
Lee et al.

(10) Patent No.: US 11,778,814 B2
(45) Date of Patent: Oct. 3, 2023

(54) ONE-TIME PROGRAMMABLE MEMORY DEVICE

(71) Applicant: UNITED MICROELECTRONICS CORP., Hsin-Chu (TW)

(72) Inventors: Kuo-Hsing Lee, Hsinchu County (TW); Chun-Hsien Lin, Tainan (TW); Sheng-Yuan Hsueh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 199 days.

(21) Appl. No.: 17/329,171

(22) Filed: May 25, 2021

(65) Prior Publication Data

US 2022/0344358 A1 Oct. 27, 2022

(30) Foreign Application Priority Data

Apr. 26, 2021 (CN) .......................... 202110453777.3

(51) Int. Cl.
*H10B 20/20* (2023.01)
*H01L 29/423* (2006.01)
*H10B 10/00* (2023.01)

(52) U.S. Cl.
CPC ....... *H10B 20/20* (2023.02); *H01L 29/42364* (2013.01); *H10B 10/18* (2023.02)

(58) Field of Classification Search
CPC ........ H10B 20/20; H10B 20/25; H10B 20/65; H10B 10/18; H01L 29/42364
See application file for complete search history.

(56) References Cited

U.S. PATENT DOCUMENTS

| | | | |
|---|---|---|---|
| 10,186,516 B2 * | 1/2019 | Jin | ..................... H01L 27/11206 |
| 2012/0195091 A1 | 8/2012 | Schmitt | |
| 2016/0190145 A1 * | 6/2016 | Maekawa | ........... H01L 23/5252 257/50 |
| 2019/0157165 A1 * | 5/2019 | Kim | .................. H01L 21/82385 |

* cited by examiner

*Primary Examiner* — Allison Bernstein
(74) *Attorney, Agent, or Firm* — Winston Hsu

(57) ABSTRACT

A semiconductor device includes a substrate having an input/output (I/O) region, an one time programmable (OTP) capacitor region, and a core region, a first metal gate disposed on the I/O region, a second metal gate disposed on the core region, and a third metal gate disposed on the OTP capacitor region. Preferably, the first metal gate includes a first high-k dielectric layer, the second metal gate includes a second high-k dielectric layer, and the first high-k dielectric layer and the second high-k dielectric layer include an I-shape.

12 Claims, 7 Drawing Sheets

ONE-TIME PROGRAMMABLE MEMORY DEVICE

BACKGROUND OF THE INVENTION

1. Field of the Invention

The invention relates to a non-volatile memory device, and more particularly to a one-time programmable memory device.

2. Description of the Prior Art

Semiconductor memory devices including non-volatile memory devices have been widely used in various electronic devices such as cellular phones, digital cameras, personal digital assistants (PDAs), and other applications. Typically, non-volatile memory devices include multi-time programmable (MTP) memory devices and one-time programmable (OTP) memory devices. In contrast to rewritable memories, OTP memory devices have the advantage of low fabrication cost and easy storage. However, OTP memory devices could only perform a single data recording action such that when certain memory cells of a destined storage block were stored with a writing program, those memory cells could not be written again.

Since current OTP memory devices still have the disadvantage of weak reading current and longer stress time under program mode, how to improve the current architecture for OTP memory devices has become an important task in this field.

SUMMARY OF THE INVENTION

According to an embodiment of the present invention, a semiconductor device includes a substrate having an input/output (I/O) region, an one time programmable (OTP) capacitor region, and a core region, a first metal gate disposed on the I/O region, a second metal gate disposed on the core region, and a third metal gate disposed on the OTP capacitor region. Preferably, the first metal gate includes a first high-k dielectric layer, the second metal gate includes a second high-k dielectric layer, and the first high-k dielectric layer and the second high-k dielectric layer include an I-shape.

According to another aspect of the present invention, a semiconductor device includes a substrate having an input/output (I/O) region, a core region, and an one time programmable (OTP) capacitor region, a first metal gate on the I/O region, a second metal gate on the core region, and a third metal gate on the OTP capacitor region. Preferably, the first metal gate includes a first high-k dielectric layer, the second metal gate includes a second high-k dielectric layer, and each of the first high-k dielectric layer and the second high-k dielectric layer comprise a U-shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
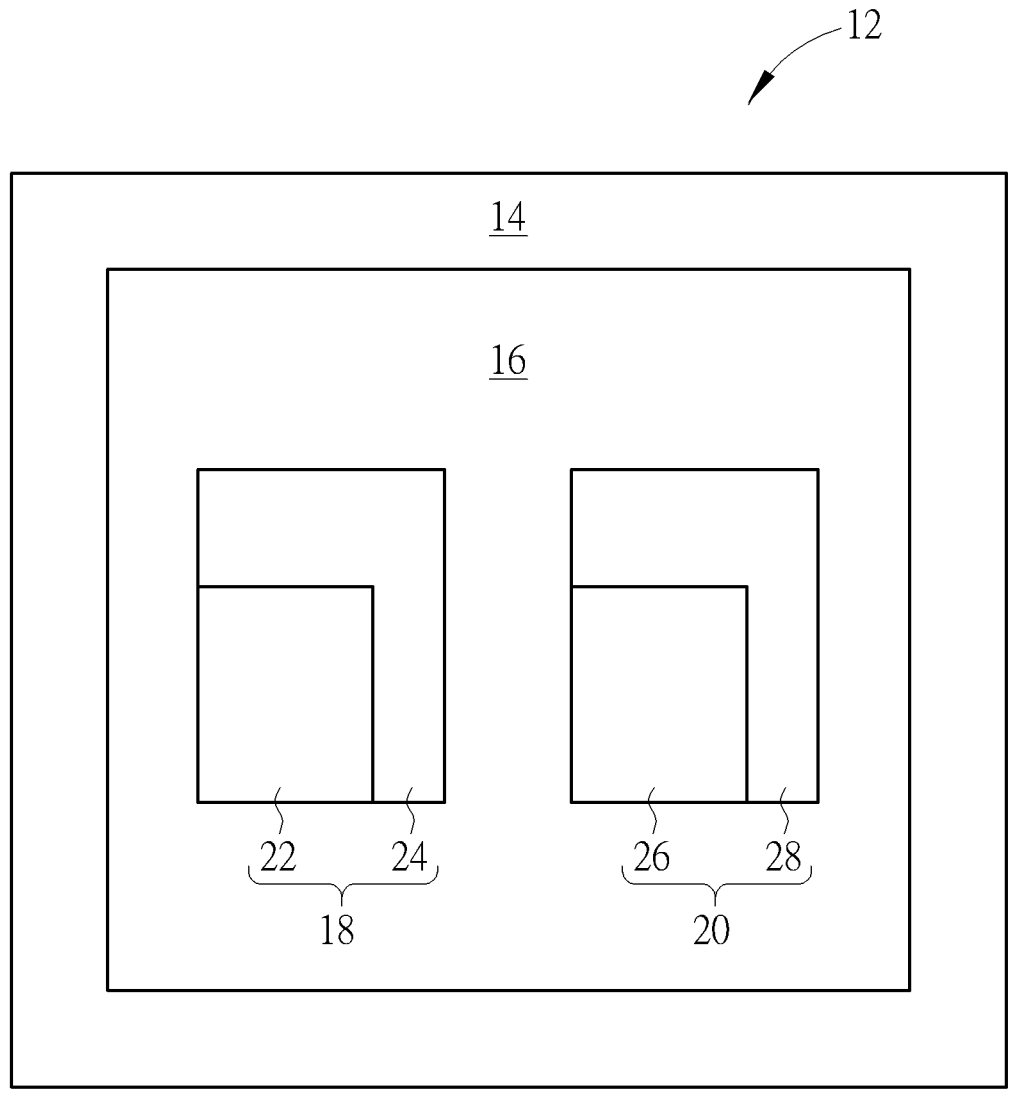
FIG. 1 illustrates a top view of a semiconductor device according an embodiment of the present invention.
Figure 2:
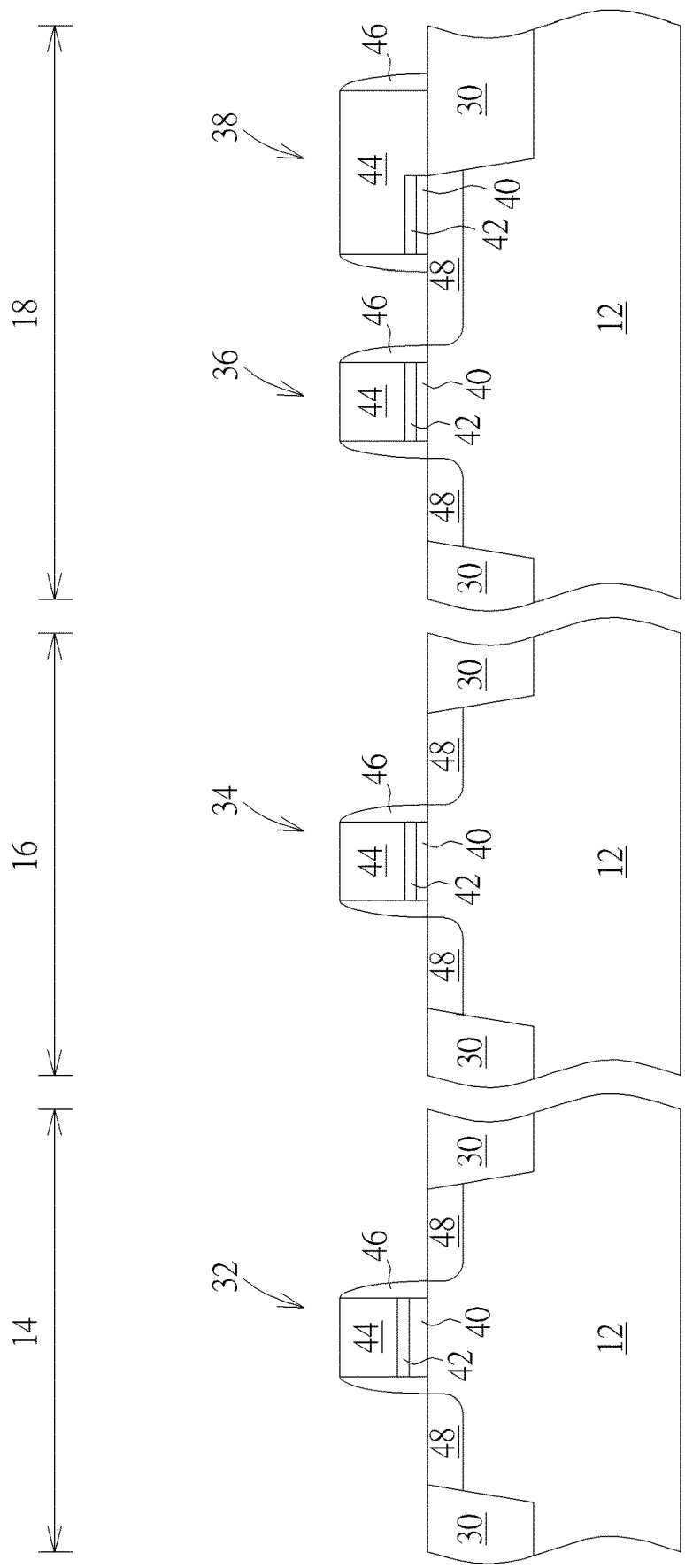
FIGS. 2-4 are cross-section views illustrating a method for fabricating the semiconductor device with respect to different regions shown in FIG. 1.
Figure 3:
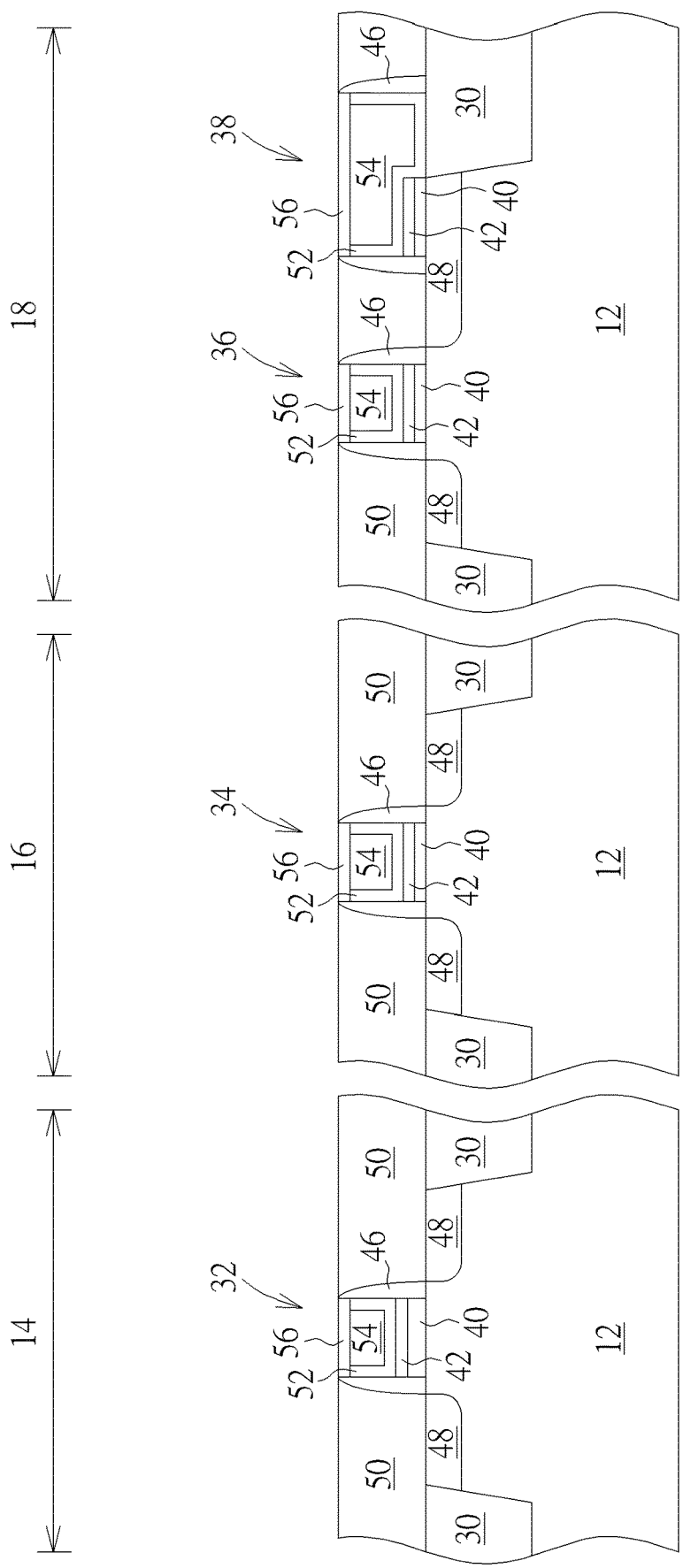
Figure 4:
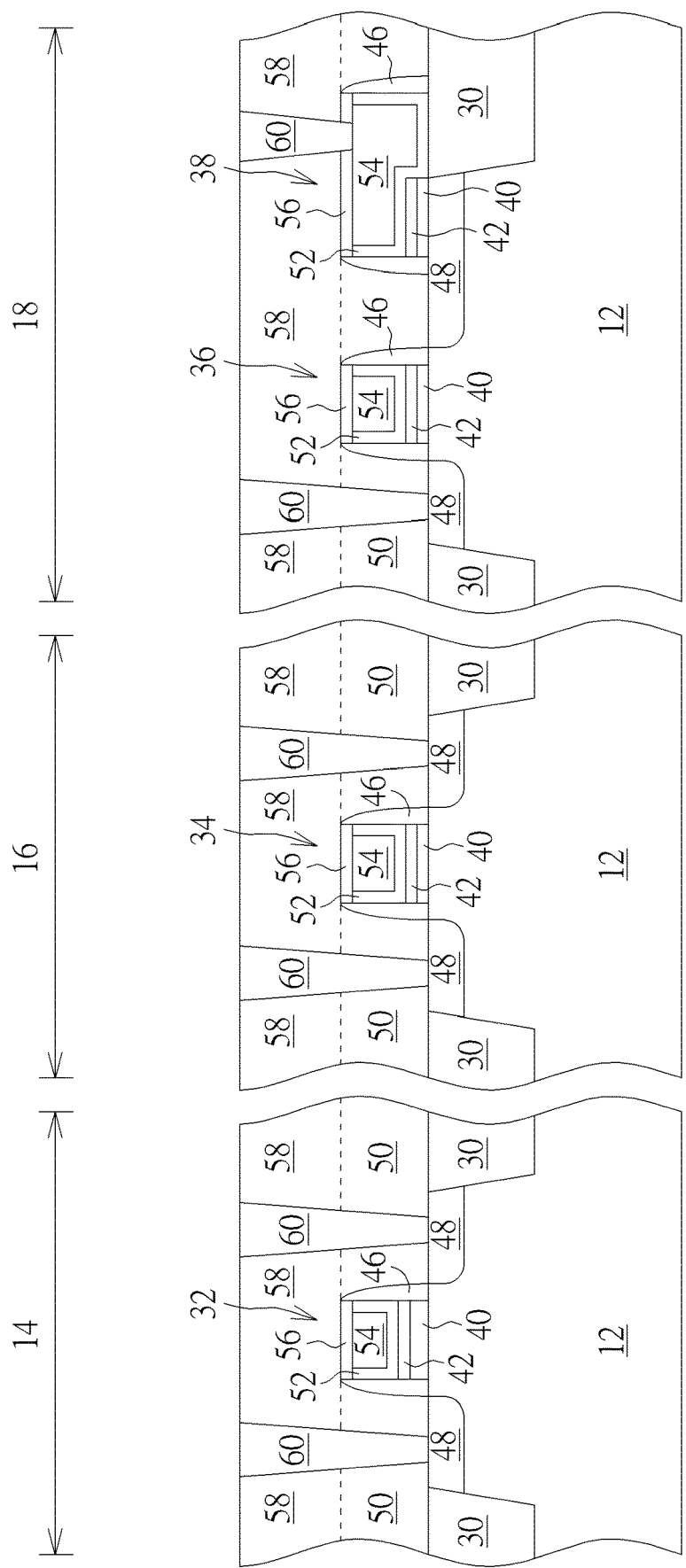

Referring to FIGS. 1-4, FIGS. 1-4 illustrate a method for fabricating a semiconductor device according to an embodiment of the present invention, in which FIG. 1 illustrates a top view of the semiconductor device and FIGS. 2-4 are cross-section views illustrating a method for fabricating the semiconductor device with respect to different regions shown in FIG. 1. As shown in FIGS. 1-2, a substrate 12 such as a silicon substrate or silicon-on-insulator (SOI) substrate is provided and an input/output (I/O) region 14, a core region 16, an one time programmable (OTP) capacitor region 18, and a static random access memory (SRAM) region 20 are defined on the substrate 12, in which the OTP capacitor region 18 further includes a cell region 22 and a periphery region 24 and the SRAM region 20 also includes a cell region 26 and a periphery region 28.

In this embodiment, the metal-oxide semiconductor (MOS) transistors are preferably formed on the I/O region 14 and the core region 16 while integrated structures including MOS transistor and OTP capacitor are formed on the OTP capacitor region 18. It should also be noted that since the present invention pertains to integrating metal gate structures onto the I/O region 14, the core region 16, and the OTP capacitor region 18, elements on the SRAM region 20 are not shown in the later process. Next, a shallow trench isolation (STI) 30 is formed in the substrate 12 on each of the I/O region 14, the core region 16, and the OTP capacitor region 18, and an ion implantation process is conducted to implant n-type or p-type dopants into the substrate 12 for forming well regions.

Next, at least a gate structure 32 is formed on the I/O region 14, at least a gate structure 34 is formed on the core region 16, and gate structures 36, 38 are formed on the OTP capacitor region 18. In this embodiment, the formation of the gate structures 32, 34, 36, 38 could be accomplished by a gate first process, a high-k first approach from gate last process, or a high-k last approach from gate last process. Since this embodiment pertains to a high-k first approach, a gate dielectric layer 40 or interfacial layer made of silicon oxide, silicon oxynitride (SiON), silicon oxycarbide (SiOC), or silicon oxyfluoride (SiOF), a high-k dielectric layer 42, a gate material layer 44 made of polysilicon, and a selective hard mask (not shown) could be formed sequentially on the substrate 12, and a pattern transfer process is then conducted by using a patterned resist (not shown) as mask to remove part of the gate material layer 44, part of the high-k dielectric layer 42, and part of the gate dielectric layer 40 through single or multiple etching processes. After stripping the patterned resist, gate structures 32, 34, 36, 38 each composed of a patterned gate dielectric layer 40, a patterned high-k dielectric layer 42, and a patterned gate material layer 44 are formed on the substrate 12.

In this embodiment, the high-k dielectric layer 42 is preferably selected from dielectric materials having dielectric constant (k value) larger than 4. For instance, the high-k dielectric layer 42 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

It should be noted that the thickness of the gate dielectric layers 40 on each of the core region 16 and the OTP capacitor region 18 are preferably the same while the thickness of the gate dielectric layers 40 on these two regions 16, 18 is less than the thickness of the gate dielectric layer 40 on the I/O region 14. For instance, the thickness of the gate dielectric layer 40 on the I/O region 14 is preferably between 25-45 Angstroms or most preferably at 35 Angstroms, the thickness of the gate dielectric layer 40 on the core region 16 is preferably between 10-20 Angstroms or most preferably at 15 Angstroms, and the thickness of the gate dielectric layer 40 on the OTP capacitor region 18 is also between 10-20 Angstroms or most preferably at 15 Angstroms. Moreover, the high-k dielectric layers 42 on each of the I/O region 14, core region 16, and OTP capacitor region 18 preferably share equal thickness and the thickness of the high-k dielectric layer 42 on each of the regions 14, 16, 18 is preferably between 13-23 Angstroms or most preferably at 18 Angstroms.

According to an embodiment of the present invention, the formation of gate dielectric layers 40 having different thicknesses on the above regions 14, 16, 18 could be accomplished by first forming a gate dielectric layer (not shown) on the I/O region 14, core region 16, and OTP capacitor region 18, forming a patterned mask (not shown) on the core region 16 and the OTP capacitor region 18, and then forming another gate dielectric layer on the previously gate dielectric layer on the I/O region 14. This then forms a gate dielectric layer on the core region 16 and a gate dielectric layer on the OTP region 18 each having a total thickness less than the total thickness of the gate dielectric layer on the I/O region 14. Nevertheless, according to other embodiment of the present invention, it would also be desirable to first form a gate dielectric layer (not shown) on the I/O region 14, core region 16, and OTP capacitor region 18, form a patterned mask on the I/O region 14, and then conduct an etching process to remove part of the gate dielectric layer on the core region 16 and OTP capacitor region 18 so that total thickness of the remaining gate dielectric layer on each of the core region 16 and OTP capacitor region 18 is less than total thickness of the gate dielectric layer on the I/O region 14, which is also within the scope of the present invention.

Next, at least a spacer 46 is formed on the sidewalls of each of the gate structures 32, 34, 36, 38 and then a doped region 48 or source/drain regions are formed in the substrate 12 adjacent to one side or two sides of the gate structures 32, 34, 36, 38. In this embodiment, the spacer 46 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example SiO$_2$, SiN, SiON, SiCN, or combination thereof. The doped region 48 or source/drain regions could include n-type dopants or p-type dopants depending on the type of device being fabricated.

It should be noted that even though the doped regions 48 are formed in the substrate 12 after forming the gate structures 32, 34, 36, 38 in the aforementioned embodiment, according to other embodiment of the present invention it would also be desirable to first form the gate structures 32, 34, 36, form doped regions 48 adjacent to two sides of the gate structures 32, 34, 36, and them form the gate structure 38. By using this approach, the doped region 48 could be further extended under the gate structure 38. Moreover, according to yet another embodiment of the present invention, it would also be desirable to first form the gate structures 32, 34, 36, 38, form a patterned mask (not shown) on the gate structures 32, 34, 36, conduct a tilted angle ion implantation process to implant ions into the substrate 12 directly under the gate structure 38 for forming the doped region 48, remove the patterned mask, and then conduct another ion implantation process to form the rest of the doped regions 48 adjacent to two sides of the gate structures 32, 34, 36, which is also within the scope of the present invention.

Next, as shown in FIG. 3, an interlayer dielectric (ILD) layer 50 is formed on the gate structures 32, 34, 36, 38 and the STI 30 and a planarizing process such as chemical mechanical polishing (CMP) process is conducted to remove part of the ILD layer 50 for exposing the gate material layers 44 made of polysilicon so that the top surfaces of the gate material layers 44 and the ILD layer 50 are coplanar. Next, a replacement metal gate (RMG) process is conducted to transform the gate structures 32, 34, 36, 38 into metal gate. For instance, the RMG process could be accomplished by first conducting a selective dry etching or wet etching process using etchants including but not limited to for example ammonium hydroxide (NH$_4$OH) or tetramethylammonium hydroxide (TMAH) to remove the gate material layers 44 from gate structures 32, 34, 36, 38 for forming recesses (not shown) in the ILD layer 50. Next, conductive layers including a work function metal layer 52 and a low resistance metal layer 54 are formed in each of the recesses, and a planarizing process such as CMP is conducted to remove part of low resistance metal layer 54 and part of work function metal layer 52 so that the top surfaces of the U-shaped work function metal layer 52, the low resistance metal layer 54, and the ILD layer 50 are coplanar.

In this embodiment, the work function metal layer 52 is formed for tuning the work function of the metal gate in accordance with the conductivity of the device. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof. Next, part of the work function metal layer 52 and part of the low resistance metal layer 54 are removed to form recesses (not shown), and a hard mask 56 is then formed into each of the recesses so that the top surfaces of the hard masks 56 and ILD layer 50 are coplanar. The hard mask 56 could be made of material including but not limited to for example SiO₂, SiN, SiON, SiCN, or combination thereof.

Next, as shown in FIG. 4, another ILD layer 58 could be formed on the gate structures 32, 34, 36, 38 and the ILD layer 50, and a photo-etching process is conducted by using a patterned mask (not shown) as mask to remove part of the ILD layers 58, 50 adjacent to the gate structures 32, 34, 36, 38 for forming contact holes (not shown) exposing the doped regions 48 and the top surface of the conductive layer 54. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned conductive materials for forming contact plugs 60 directly contacting the doped regions 48 and the gate structure 38. This completes the fabrication of a semiconductor device according to an embodiment of the present invention.

Referring again to FIG. 4, FIG. 4 illustrates a structural view of a semiconductor device according to an embodiment of the present invention. As shown in FIG. 4, the I/O region 14 includes a metal gate transistor, the core region 16 includes another metal gate transistor, and the OTP capacitor region 18 includes a combined one transistor one capacitor (1T1C) structure made of two metal gate structures. Preferably, the doped region 48 directly under the gate structure 38 could be used as a capacitor bottom electrode, the gate dielectric layer 40 in the gate structure 38 could be used as a capacitor dielectric layer, and the work function metal layer 52 and low resistance metal layer 54 within the gate structure 38 could be used as a capacitor top electrode. As disclosed previously, the thickness of the gate dielectric layer 40 on the core region 16 is preferably equal to the thickness of the gate dielectric layer 40 on the OTP capacitor region 18 while the thickness of the gate dielectric layer 40 on both core region 16 and OTP capacitor region 18 is less than the thickness of the gate dielectric layer 40 on the I/O region 14. By forming thinner gate dielectric layer 40 on the OTP capacitor region 18, it would be desirable to lower voltages required by the capacitors for programming so that performance of the device could be improved substantially.

Figure 5:
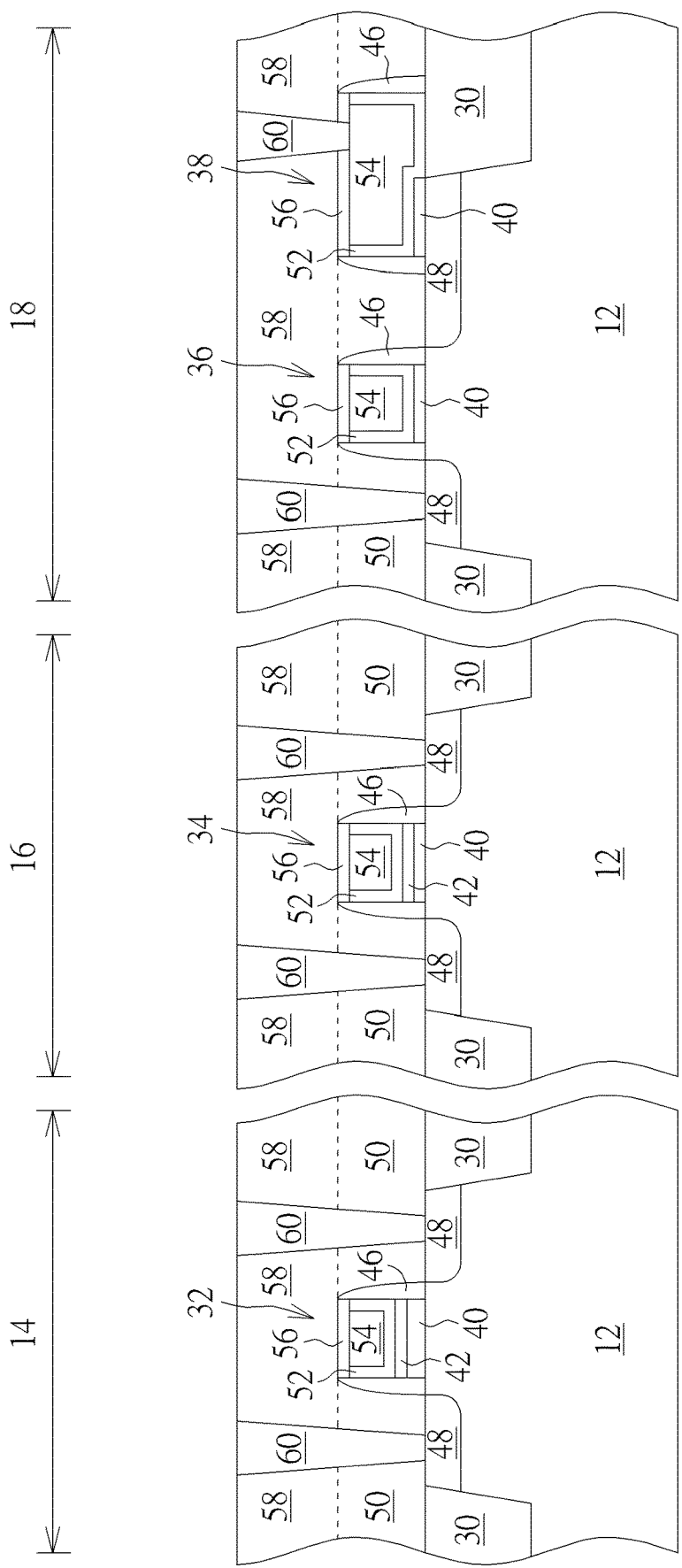
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, it would be desirable to first conduct the high-k first process as disclosed in FIG. 2 by forming a gate dielectric layer 40 and high-k dielectric layer 42 on each of the I/O region 14, core region 16, and OTP capacitor region 18, remove the high-k dielectric layer 42 on the OTP capacitor region 18 but keeping the high-k dielectric layer 42 on the I/O region 14 and the core region 16, form the gate material layer 44 on the I/O region 14, core region 16, and OTP capacitor region 18, and then conduct a pattern transfer process to remove part of the gate material layer 44, part of the high-k dielectric layer 42, and part of the gate dielectric layer 40 for forming gate structures 32, 34, 36, 38 on the I/O region 14, the core region 16, and the OTP capacitor region 18. Next, elements including spacers 46 and doped regions 48 are formed, and then a RMG process is conducted according to FIG. 3 to transform the polysilicon gates into metal gates. In contrast to the I-shaped high-k dielectric layer 42 on the I/O region 14, core region 16, and OTP capacitor region 18 directly contacting the work function metal layer 52 in the aforementioned embodiment, the high-k dielectric layer 42 of the metal gate on the OTP capacitor region 18 is completely removed in this embodiment so that the metal gates on the OTP capacitor region 18 would have the gate dielectric layer 40 contacting the work function metal layer 52 directly while the metal gates on the I/O region 14 and core region 16 still having I-shaped high-k dielectric layer 42 directly contacting the work function metal layer 52.

Figure 6:
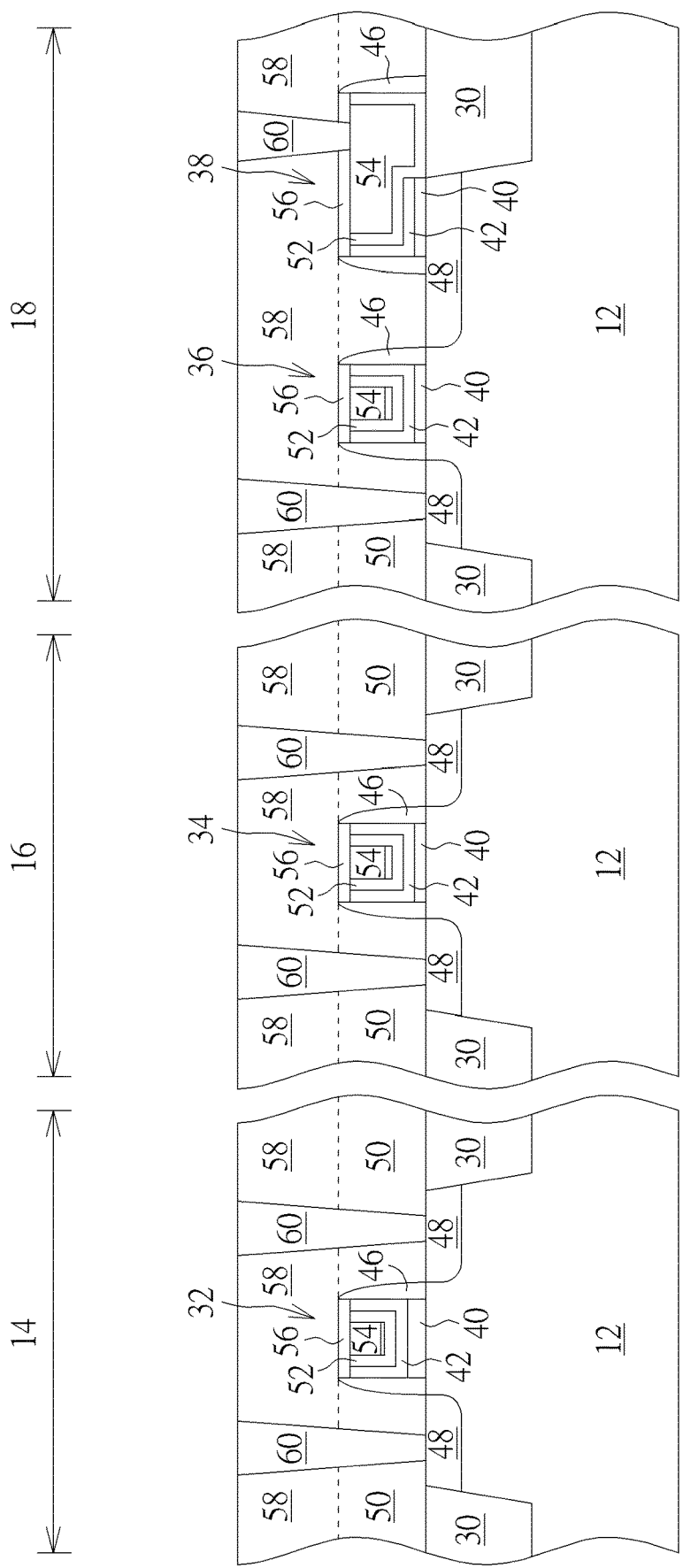
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, in contrast to the aforementioned embodiment of using a high-k first approach to form metal gates on the I/O region 14, core region 16, and OTP capacitor region 18, it would also be desirable to apply a high-k last approach for fabricating metal gates on the I/O region 14, core region 16, and OTP capacitor region 18. Structurally, since the high-k dielectric layer 42 is filled into the recesses after removing the gate material layer 44, the high-k dielectric layer 42 on each of the I/O region 14, core region 16, and OTP capacitor region 18 would include U-shape cross-section. Similar to the embodiments shown in FIGS. 4-5, the thickness of the gate dielectric layer 40 on the core region 16 is preferably equal to the thickness of the gate dielectric layer 40 on the OTP capacitor region 18 while the thickness of the gate dielectric layer 40 on both core region 16 and OTP capacitor region 18 is less than the thickness of the gate dielectric layer 40 on the I/O region 14.

Figure 7:
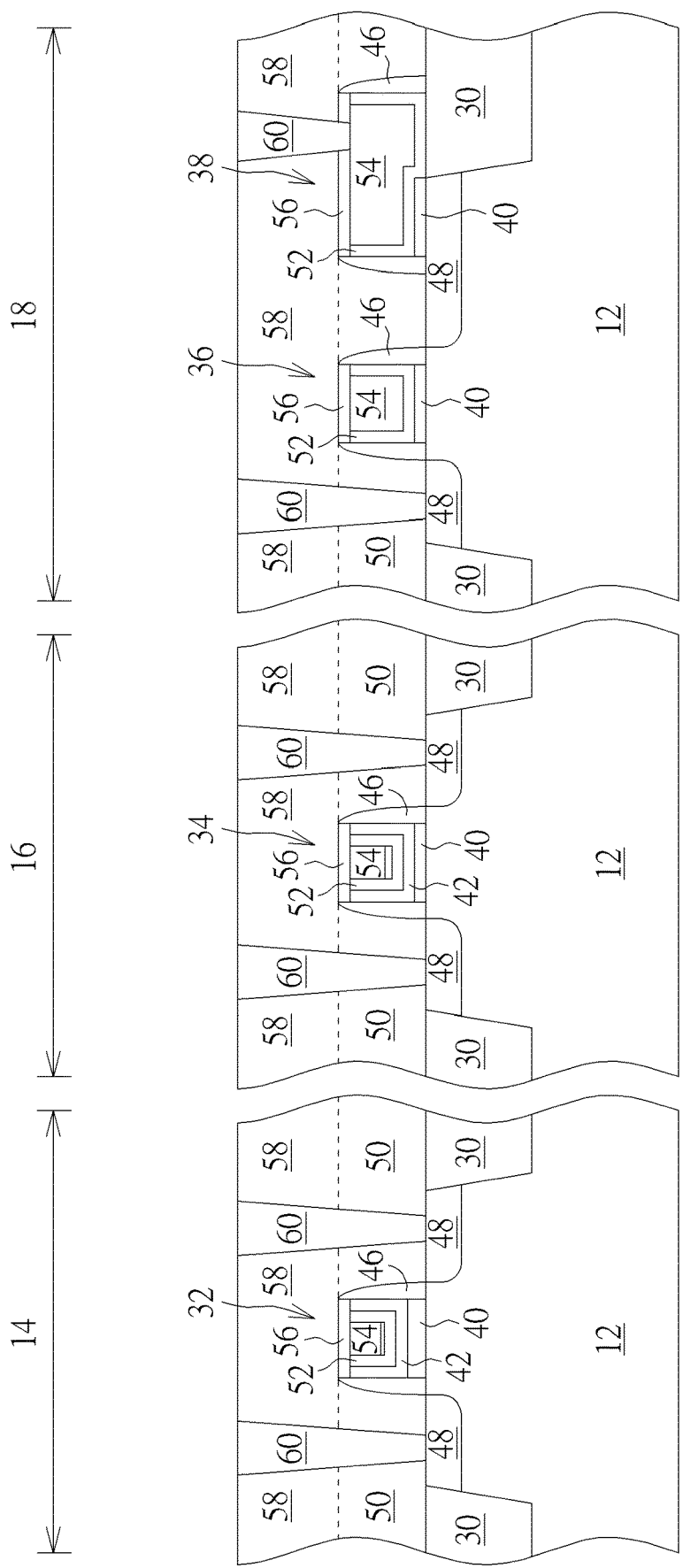
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, it would be desirable to combine the embodiments in FIGS. 5-6 by first using a high-k last approach to form U-shape high-k dielectric layer 42 on each of the I/O region 14, core region 16, and OTP capacitor region 18, removing the high-k dielectric layer 42 on the OTP capacitor region 18 but keeping the high-k dielectric layer 42 on the I/O region 14 and the core region 16, and then forming a work function metal layer 52 and low resistance metal layer 54 on the high-k dielectric layer 42 on I/O region 14 and core region 16 and the gate dielectric layer 40 on the OTP capacitor region 18. Similar to the embodiments shown in FIGS. 4-6, the thickness of the gate dielectric layer 40 on the core region 16 is preferably equal to the thickness of the gate dielectric layer 40 on the OTP capacitor region 18 while the thickness of the gate dielectric layer 40 on both core region 16 and OTP capacitor region 18 is less than the thickness of the gate dielectric layer 40 on the I/O region 14. As stated previously, by forming thinner gate dielectric layer 40 on the OTP capacitor region 18, it would be desirable to lower voltages needed by the capacitors for programming so that performance of the device could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having an input/output (I/O) region, a core region, and an one time programmable (OTP) capacitor region;
   a first metal gate on the I/O region, wherein the first metal gate comprises a first high-k dielectric layer;
   a second metal gate on the core region, wherein the second metal gate comprises a second high-k dielectric layer and the first high-k dielectric layer and the second high-k dielectric layer comprise an I-shape;
a third metal gate on the OTP capacitor region, wherein a bottom surface of the first metal gate, a bottom surface of the second metal gate and a bottom surface of the third metal gate are aligned with each other; and
a fourth metal gate on the OTP capacitor region and disposed beside the third metal gate, wherein a portion of the fourth metal gate disposed on a shallow trench isolation which is disposed in the substrate, and the other portion of the fourth metal gate disposed on a doped region.

2. The semiconductor device of claim 1, wherein the third metal gate comprises a third high-k dielectric layer and the third high-k dielectric layer comprises an I-shape.

3. The semiconductor device of claim 1, wherein the first metal gate comprises a first gate dielectric layer, the second metal gate comprises a second gate dielectric layer, and the third metal gate comprises a third gate dielectric layer.

4. The semiconductor device of claim 3, wherein a thickness of the second gate dielectric layer is less than a thickness of the first gate dielectric layer.

5. The semiconductor device of claim 3, wherein a thickness of the third gate dielectric layer is less than a thickness of the first gate dielectric layer.

6. The semiconductor device of claim 3, wherein a thickness of the second gate dielectric layer is equal to a thickness of the third gate dielectric layer.

7. A semiconductor device, comprising:
a substrate having an input/output (I/O) region, a core region, and an one time programmable (OTP) capacitor region;
a first metal gate on the I/O region, wherein the first metal gate comprises a first high-k dielectric layer;
a second metal gate on the core region, wherein the second metal gate comprises a second high-k dielectric layer and the first high-k dielectric layer and the second high-k dielectric layer comprise a U-shape;
a third metal gate on the OTP capacitor region, wherein a bottom surface of the first metal gate, a bottom surface of the second metal gate and a bottom surface of the third metal gate are aligned with each other; and
a fourth metal gate on the OTP capacitor region and disposed beside the third metal gate, wherein a portion of the fourth metal gate disposed on a shallow trench isolation which is disposed in the substrate, and the other portion of the fourth metal gate disposed on a doped region.

8. The semiconductor device of claim 7, wherein the third metal gate comprises a third high-k dielectric layer and the third high-k dielectric layer comprises a U-shape.

9. The semiconductor device of claim 7, wherein the first metal gate comprises a first gate dielectric layer, the second metal gate comprises a second gate dielectric layer, and the third metal gate comprises a third gate dielectric layer.

10. The semiconductor device of claim 9, wherein a thickness of the second gate dielectric layer is less than a thickness of the first gate dielectric layer.

11. The semiconductor device of claim 9, wherein a thickness of the third gate dielectric layer is less than a thickness of the first gate dielectric layer.

12. The semiconductor device of claim 9, wherein a thickness of the second gate dielectric layer is equal to a thickness of the third gate dielectric layer.

* * * * *